(12) United States Patent
Maydanich et al.

(10) Patent No.: US 6,414,316 B1
(45) Date of Patent: Jul. 2, 2002

(54) PROTECTIVE COVER AND ATTACHMENT METHOD FOR MOISTURE SENSITIVE DEVICES

(76) Inventors: Fyodor I. Maydanich, 2546 N. 124th St. Apt. 316, Wauwatosa, WI (US) 53226; Yakov Shvetskiy, 1120 Olive Ave., Apt. 118, Sunnyvale, CA (US) 94086

( * ) Notice: Subject to any disclaimer, the term of this patent is extended or adjusted under 35 U.S.C. 154(b) by 13 days.

(21) Appl. No.: 09/726,723

(22) Filed: Nov. 30, 2000

(51) Int. Cl.[7] .................................................. G01T 7/00
(52) U.S. Cl. ............................ 250/370.11; 250/361 R; 250/366; 250/368; 250/372; 359/513
(58) Field of Search .................... 250/370.11, 361 R, 250/366, 368, 372; 359/513

(56) References Cited

U.S. PATENT DOCUMENTS 5,132,539 A    7/1992   Kwasnick et al.
5,497,268 A  * 3/1996   Tang ........................... 357/513
5,847,396 A  * 12/1998  Lingren et al. ............. 250/366
6,172,371 B1 * 1/2001   DeJule et al. .......... 250/370.11

* cited by examiner

*Primary Examiner*—Constantine Hannaher
*Assistant Examiner*—Andrew Israel

(57) ABSTRACT

A radiation imaging device includes a scintillator, a cover and an imager substrate. A photodetector array comprising a plurality of photodetectors is disposed on the imager substrate. The cover is hermetically bonded to the substrate with a sealant. The cover has outer sidewalls and a top side connecting the outer sidewalls. In attaching to the substrate, the cover is disposed on the imager substrate to surround the scintillator. A curable sealant is applied along the outer surface of the cover. The sealant is then cured to hermetically bond the cover to the substrate.

23 Claims, 1 Drawing Sheet

PROTECTIVE COVER AND ATTACHMENT METHOD FOR MOISTURE SENSITIVE DEVICES

BACKGROUND OF THE INVENTION

1. Field of the Invention

The present invention relates to radiation imaging systems. More particularly, the invention relates to a protective cover for an x-ray imager suitable for use in medical diagnostic applications. A method of attaching the cover to the upper surface of the x-ray imager's substrate is also provided.

2. The Prior Art

A number of protective covers for radiation imaging systems used for medical and industrial purposes are known. For example, U.S. Pat. No. 5,132,539 to Kwasnick et al. relates to a planar x-ray imager having a moisture-resistant sealing structure.

Such sealing covers are desirable to protect the scintillator material of the imaging system from moisture absorption. The covers are especially desirable when the end use environment has a high humidity content. For example, cesium iodide, a common scintillator material, is hygroscopic and exhibits a tendency to absorb moisture from the atmosphere around it. In so doing, the material becomes hydrolyzed with a consequent degradation in its luminescent properties. In radiation imaging systems, the radiation typically comprises x-ray or gamma rays. This radiation is absorbed in the scintillator material, resulting in the generation of photons of light. These photons in turn are detected by photodetectors to generate an electrical output signal. This signal is processed to drive a visual display device or other equipment to analyze the detected electromagnetic radiation patterns. Chemical reactions occur continually between the cesium oxide scintillator and the atmospheric moisture of the radiation detector's end use environment. These reactions lead to the degradation of the detector resolution. They also lead to the deterioration of the conversion factor and the decline of detector/device reliability.

Known digital x-ray detectors employ a cover/epoxy seal/x-ray imager interface to isolate the detector's scintillator from atmospheric moisture. The x-ray imaging device includes a photodetector array disposed on a substrate with a scintillator disposed on the substrate. A cover is bonded to the substrate with an epoxy bead so as to extend over the scintillator.

This existing cover/seal/substrate interface construction allows some ambient moisture penetration through the epoxy bead driven by moisture diffusion through the epoxy. Moreover, the process of cover attachment to the substrate suffers from a lack of consistent and repeatable output. The attachment process requires extensive and complicated process fixtures. It also requires a high degree of manual dexterity, and a process duration of 48–72 hours.

Hence, a cover and attachment method is needed that will reduce moisture penetration into the cesium iodide array from diffusion.

BRIEF SUMMARY OF THE INVENTION

A radiation imaging device is provided with a cover/imager substrate interface to isolate the scintillator from the end use environment. The device includes a scintillator comprising a moisture sensitive material, such as cesium iodide. A photodetector array comprising a plurality of photodetectors is disposed on an imager substrate. A cover is hermetically bonded to the substrate with a sealant. The cover is generally in the form of a "picture frame" or open-ended box. The cover has first and second surfaces and a third surface connecting the first and second surfaces. The cover comprises a material being substantially impervious to moisture and having a low degree of radiation attenuation.

A method of attaching the protective cover to a radiation imaging device is also provided. In accordance with this method, the cover is disposed on the imager substrate to surround the scintillator. A curable sealant is then applied continuously along the outer surface of the cover. The sealant is then cured to hermetically bond the cover to the substrate.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
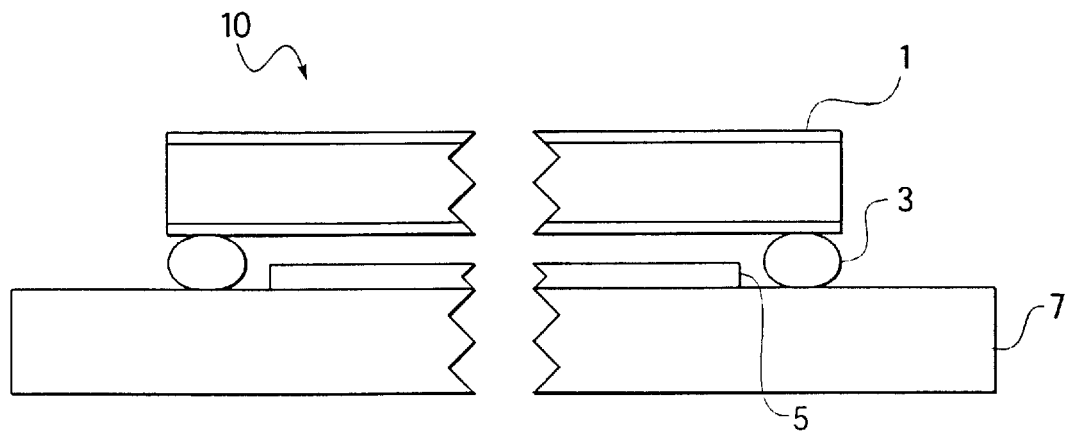
FIG. 1 is a schematic cross-sectional diagram of the sealing scheme of a prior art radiation imaging device.

Referring to FIG. 1, a simplified diagram of an existing sealing scheme is shown. In FIG. 1, an x-ray imaging device 10 includes a photodetector array (not shown) disposed on a substrate 7. A scintillator 5 is disposed on substrate 7. A cover 1 is bonded to substrate 7 with epoxy bead 3 so as to extend over scintillator 5.

Figure 2:
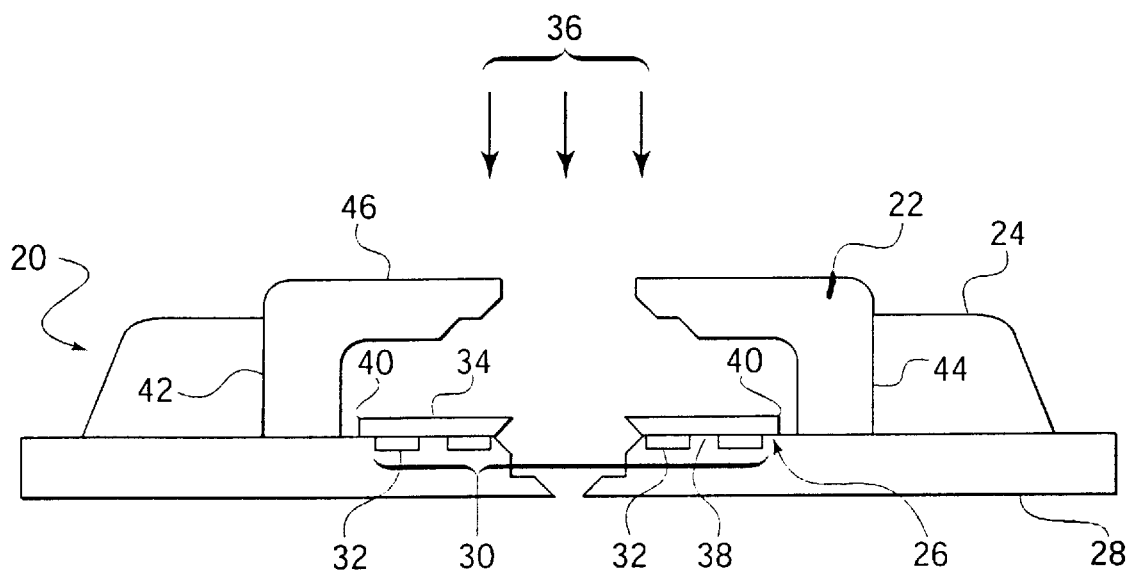
FIG. 2 is a schematic cross-sectional diagram of a radiation imaging device in accordance with an embodiment of the present invention.

Now referring to FIG. 2, the radiation imaging device 20 of a preferred embodiment is shown. Device 20 includes a photodetector array 30 disposed on a substrate 28 and a scintillator 26 disposed adjacent to the photodetector array. A cover 22 is hermetically bonded to substrate 28 and extends over scintillator 26. The photodetector array is coupled to a processing circuit (not shown). The processing circuit processes the electrical signals for use in display and analysis equipment (not shown).

Photodetector array 30 comprises a plurality of photodetectors 32 arranged and electrically connected in a pattern, typically rows and columns. The photodetectors are disposed on imager substrate 28 to form an array. The array can be of any size and shape appropriate for the use of imaging device 20. For example, the array may be adapted for medical analysis of particular portions of the body. The photodetectors are advantageously photodiodes and alternatively may comprise other known solid state x-ray detectors, such as direct detection arrays, i.e. $HgI_2$ (mercury iodide) and $PbI_2$ (lead iodide) photodetector devices. A connector (not shown) carries the electrical signals generated in the photodetectors to the processing circuit.

Scintillator 26 is positioned adjacent to photodetector array 30 and arranged so that light photons from the scintillator readily pass into photodetectors. An optical index matching substance may be provided in a separate layer between the two arrays. Other materials which efficiently transfer photons from the scintillator to the photodetectors may also be used. As illustrated in FIG. 2, scintillator 26 comprises a substantially homogeneous block of scintillator material. Alternatively, separate scintillator elements (not shown) may be diced, or cut, from a larger block of scintillator material. Scintillator elements may also be separately grown or deposited in columnar structures using known methods. For example, vapor deposition or sputtering can be used for this purpose. Scintillator 26 comprises a first end surface 34 through which incident x-ray or gamma radiation 36 enters the scintillator. A second end surface 38 is opposite to the first end surface. The light photons pass through surface 38 to the adjoining photodetector array 30. Scintillator 26 further has outer peripheral edges 40 extending between first end surface 34 and second end surface 38. Cesium iodide is typically used to form scintillator 26. Alternatively, other known scintillating materials can be used.

Cover 22 is disposed around that portion of photodetector array 30 receiving the light generated by the scintillators. As shown in FIG. 2, cover 22 has outer sidewalls extending between a top side 46 of cover 22 and the top surface of substrate 28. Left and right sides 42, 44 (from the viewer's perspective) of the outer sidewalls are shown in FIG. 2 but it is to be understood that the outer sidewalls extend around the outer surface of cover 22. Top side 46 connects the outer sidewalls to close the cover at the top. The bottom portion of the cover, that is the open face or inner surface of cover 22 is closed by the surface of substrate 28. This "open face" cover/substrate interface drastically reduces the direct moisture path from the end use environment to the scintillator local ambient environment. Due to the interposition of solid wall material between the end use and local environments, diffusion through the epoxy seal is practically eliminated. Unlike the prior art, moisture has to travel both through the epoxy seal and the outer sidewalls of the cover. Thus, the "open face" cover/substrate interface prevents continuous chemical reactions between the scintillator material, for example, cesium iodide, and atmospheric moisture. This arrangement results in improved x-ray detector reliability. In comparison to prior art sealing schemes, moreover, the seal is far less susceptible, if at all, to shrinkage, thermal expansion and viscosity changes which caused cracks and leakages in prior sealing schemes.

In order to be used for x-ray detection applications, the cover's material should have a low degree of x-ray attenuation. Preferably, the x-ray attenuation is below 3–5%, desirably from 1 to 3%, and preferably from 1.5 to 2.5%. The coefficient of thermal expansion of the cover advantageously closely matches the coefficient of thermal expansion of substrate 28. The cover material should also have sufficient stiffness to assure the imager's structural integrity.

To produce the material and cover configuration, a highly compacted particulate and continuous fiber reinforced metal alloy can be used. For example, a metal alloy produced by the Advanced Pressure Infiltration Casting process available from Metal Matrix Cast Composites, Inc., 101 Clematis Ave., Waltham, Mass. 02453-7012 can be used. Cover materials disclosed in U.S. Pat. No. 5,132,539 to Kwasnick et al. may also be used.

To form the cover/substrate interface, cover 22 is first disposed over substrate 28. Continuous beads of a sealant 24 are then formed along the outer surface of cover 22. Preferably, sealant 24 comprises a moisture resistant adhesive such as an epoxy. For example, EP38 available from Master Bond, Inc., 154 Hobart Street, Hackensack, N.J. 07601, for curing at room temperature can be used. Alternatively, other known adhesives such as acrylics and acrylated urethanes can be used such as adhesives 3103 and 3525 available from LOCTITE Corporation, 1001 Trout Brook Crossing, Rocky Hill, Conn. 06067-3910, for curing by ultraviolet (UV) light. Other less preferred sealants include UV15-7, UV15-7SP4 available from Master Bond, Inc.

Cover 22 is hermetically bonded to substrate 28 and extends above scintillator 26. Cover 22 forms a seal which prevents moisture in liquid or vapor from passing through the cover. Cover 22 has no strong interaction with the radiation to be detected by the imaging device. It allows a maximum amount of the incident radiation from source 36 to enter scintillator 26 without absorption or scattering.

The "picture frame" cover/substrate interface allows for a higher degree of precision. It affords repeatable alignment between the cover's inner surfaces and the edges of the scintillator's cesium iodide active array. The shape and positioning of the cover and a simple fixture utilization for sealant bead formation defines the interface. The "open face" cover/substrate's common boundary significantly simplifies the entire sealant application procedure. It enables an ease of use for manual and semiautomatic means of sealant application during the manufacturing process.

In attaching to a radiation imaging device, cover 22 is disposed on imager substrate 28 of imaging device 20 to surround scintillator 26. A curable sealant 24 is then applied along the outer surface of cover 22. Sealant 24 is then cured, preferably under a nitrogen atmosphere, to hermetically bond cover 22 to substrate 28. For improved productivity, a UV cured sealant is used which leads to a substantial reduction in process duration (from 48–72 hours to 1–2 hours).

Thus, a "picture frame" shaped cover and a method of attachment is provided. The cover is radiation transmissive and minimizes scattering of light away from the scintillator. The cover outer surface is attached to the upper surface of an x-ray imager's substrate. The cover resembles a box with an open top which is placed upside down on the imager's substrate. The cover/imager's substrate interface removes an unreliable moisture barrier between the cesium iodide and the end use environment. It also eliminates the degradation of x-ray detector resolution and conversion factor due to moisture impact on the cesium iodide. In addition, the detector reliability is improved.

While preferred embodiments of the present invention have been shown and described, it is to be understood that many changes and modifications may be made thereunto without departing from the spirit and scope of the invention as defined in the appended claims.

What is claimed is:

1. A radiation imaging device comprising:
    (a) an imager substrate;
    (b) a photodetector array comprising a plurality of photodetectors disposed on said imager substrate;
    (c) a scintillator comprising a moisture sensitive material disposed adjacent to said photodetector array; and
    (d) an open-faced cover having outer sidewalls and a top side connecting said outer sidewalls, said outer sidewalls being disposed directly on said substrate and an outside surface of said outer sidewalls being hermetically bonded to the substrate with a sealant, said cover comprising a material being substantially impervious to moisture and having a low degree of radiation attenuation so as to protect the scintillator from moisture intrusion.

2. The device according to claim 1 wherein said photodetector array comprises a direct detection array comprising a plurality of direct detection materials selected from the group consisting of mercury iodide (HgI$_2$) and lead iodide (PbI$_2$) disposed on said imager substrate.

3. The device according to claim 1 wherein said cover has a coefficient of thermal expansion substantially the same as the coefficient of thermal expansion of the imager substrate.

4. The device according to claim 1 wherein said cover is produced from a highly compacted particulate and continuous fiber reinforced metal alloy.

5. The device according to claim 1 wherein the sealant comprises continuous beads of a material curable at room temperature.

6. The device according to claim 1 wherein said scintillator comprises cesium iodide.

7. The device according to claim 1 wherein said cover has an x-ray attenuation below 5%.

8. The device according to claim 1 wherein said cover has an x-ray attenuation from 1% to 3%.

9. The device according to claim 1 wherein said cover has an x-ray attenuation from 1.5% to 2.5%.

10. A method of attaching a protective cover to a radiation imaging device comprising:
   (a) providing an open-faced cover comprising a material substantially impervious to moisture and having a low degree of radiation attenuation, said cover having outer sidewalls and a top sidewall connecting said outer sidewalls;
   (b) directly disposing the cover on an imager substrate of the imaging device to surround a scintillator of the imaging device;
   (c) applying a curable sealant along the outer surface of the cover; and
   (d) curing the sealant to hermetically bond the cover to the substrate so as to protect the scintillator from moisture intrusion.

11. The method according to claim 10 wherein the sealant is cured by ultraviolet light.

12. The method according to claim 10 wherein the cover is produced from a highly compacted particulate and continuous fiber reinforced metal alloy.

13. The method according to claim 10 wherein the sealant comprises continuous beads of a material curable at room temperature.

14. The method according to claim 10 wherein the scintillator comprises cesium iodide.

15. A digital x-ray imager comprising:
   (a) an imager substrate;
   (b) a direct detection array comprising a plurality of direct photodetectors disposed on said imager substrate;
   (c) a scintillator comprising cesium iodide disposed adjacent to said direct detection array; and
   (d) an open-faced cover in the shape of a picture frame having outer sidewalls and a top connecting said outer sidewalls, said outer sidewalls being directly disposed on the substrate and an outside surface of said outer sidewalls being hermetically bonded to the substrate with continuous beads of an ultraviolet light cured sealant, said cover being x-ray transmissive and substantially impervious to moisture so as to protect the scintillator from moisture intrusion.

16. The digital x-ray imager of claim 15 wherein said direct photodetectors comprise direct detection materials selected from the group consisting of mercury iodide (HgI$_2$) and lead iodide (PbI$_2$).

17. The digital x-ray imager of claim 15 wherein said cover has a coefficient of thermal expansion substantially the same as the coefficient of thermal expansion of the imager substrate.

18. The digital x-ray imager of claim 15 wherein said cover is produced from a highly compacted particulate and continuous fiber reinforced metal alloy.

19. The digital x-ray imager of claim 15 wherein said cover has an x-ray attenuation below 5%.

20. The digital x-ray imager of claim 15 wherein said cover has an x-ray attenuation from 1% to 3%.

21. The digital x-ray imager according to claim 15 wherein said cover has an x-ray attenuation from 1.5% to 2.5%.

22. A method of attaching a protective cover to a digital x-ray imager comprising:
   (a) providing an open-faced cover in the shape of a picture frame comprising an x-ray transmissive material substantially impervious to moisture;
   (b) directly disposing the cover on an imager substrate of the digital x-ray imager to surround a cesium iodide scintillator of the x-ray imager;
   (c) applying continuous beads of an ultraviolet light curable sealant along the outer surface of the cover; and
   (d) curing the sealant to hermetically bond the cover to the substrate so as to protect the scintillator from moisture intrusion.

23. The method according to claim 22 wherein said cover is produced from a highly compacted particulate and continuous fiber reinforced metal alloy.

* * * * *

UNITED STATES PATENT AND TRADEMARK OFFICE
CERTIFICATE OF CORRECTION

PATENT NO.    : 6,414,316 B1
DATED         : July 2, 2002
INVENTOR(S)   : Fyodor I. Maydanich et al.

It is certified that error appears in the above-identified patent and that said Letters Patent is hereby corrected as shown below:

<u>Title page,</u>
Item [73], please insert item [73] containing the name of the Assignee as follows:

-- GE Medical Systems Global Technology Company, LLC., Waukesha, Wisconsin --.

Signed and Sealed this

Twentieth Day of August, 2002

Attest:

Attesting Officer

JAMES E. ROGAN
*Director of the United States Patent and Trademark Office*